United States Patent [19]
Seniuk et al.

[11] Patent Number: 5,972,568
[45] Date of Patent: Oct. 26, 1999

[54] METHOD OF MAKING SURFACE WAVE DEVICES

[75] Inventors: David R. Seniuk, Aylmer; Ji-Dong Dai, Kanata, both of Canada

[73] Assignee: Nortel Networks Corporation, Montreal; CAX

[21] Appl. No.: 08/847,528

[22] Filed: Apr. 24, 1997

[51] Int. Cl.$^6$ ........................................... G03F 7/20
[52] U.S. Cl. ........................ 430/312; 430/394; 430/313
[58] Field of Search ..................................... 430/312, 313, 430/394, 396, 5, 311; 310/313 B

[56] References Cited

U.S. PATENT DOCUMENTS

| | | | |
|---|---|---|---|
| 4,690,880 | 9/1987 | Suzuki et al. ............................ | 430/394 |
| 5,344,745 | 9/1994 | Yamanouchi ............................ | 430/313 |
| 5,563,012 | 10/1996 | Neisser .................................... | 430/311 |
| 5,604,059 | 2/1997 | Imura et al. ............................. | 430/394 |

OTHER PUBLICATIONS

"Surface Mount Type SAW Filter for Hand–held Telephones", S. Suma et al., Proc. of the Japan International Electronic Manufacturing Technology Symposium (Japan IEMT), IEEE, XP000268493, pp. 97–200, Jun. 9, 1993.

"Fabrication of 0.25 $\mu$m Surface Acoustic Wave Devices by Ion Beam Proximity Printing", D.P. Stumbo et al., Journal of Vacuum Science and Technology, Part B, vol. 9, No. 7, XP000506040, pp. 2879–2881, Nov. 1, 1991.

*Primary Examiner*—Kathleen Duda
*Attorney, Agent, or Firm*—R. John Haley

[57] ABSTRACT

A surface wave device is made by forming conductors on a surface of a piezoelectric material in a conductor pattern defined by exposing photoresist via a reticle. The conductor pattern is provided on the reticle in two parts each defining a set of substantially alternate fingers of the pattern, and the photoresist is exposed by two overlaid exposures each via a respective one of the two parts of the conductor pattern. Exposed photoresist can optionally be developed between the two exposures, and conductors can optionally be formed on the surface between the two exposures. The method reduces diffraction limits, permitting manufacture of surface wave devices with sub-micron linewidths for filtering at increased frequencies.

10 Claims, 4 Drawing Sheets

METHOD OF MAKING SURFACE WAVE DEVICES

This invention relates to a method of making surface wave devices, the term "surface wave" being used herein to embrace surface acoustic waves (SAWs), including leaky SAWs, and surface skimming bulk waves.

BACKGROUND OF THE INVENTION

It is well known that surface wave devices provide substantial benefits, such as small size, low cost, and desirable characteristics, for a variety of applications including, in particular, filtering at RF (radio frequency) and IF (intermediate frequency) in radio communications equipment such as cellular telephone base stations and terminals. Various forms of surface wave device filter are known, comprising IDTs (interdigital transducers) and possibly reflection gratings both of which are constituted by conductors deposited in a desired pattern on a surface of a piezoelectric substrate. The conductors of this pattern include periodically spaced electrodes or fingers of the IDTs or gratings, the period being determined by the wavelength $\lambda$ of the propagated surface wave for the center frequency for which the filter is designed.

Manufacture of surface wave devices for filtering at very high frequencies presents a significant problem. For example, it is increasingly desirable for cellular telephone communications equipment to mass produce low loss surface wave devices for RF filtering at a center frequency in the range of 1.8 to 2.0 GHz. For piezoelectiic substrate materials that may be used for such devices, such as quartz, lithium niobate, and lithium tantalate, this requires a sub-micron linewidth (about 0.5 $\mu$m). Surface wave devices are produced using photolithography techniques, and the established equipment for this at sub-micron wavelengths is the so-called stepper. Typically, a so-called 5× stepper, in which the pattern on the reticle from which the conductor pattern is produced is five times the size of the device pattern, can be used to provide high resolution.

However, the dense line pattern of a surface wave device means that it acts in the stepper as a diffraction grating, so that the resolution limit of the stepper is determined by the diffraction limit of its numerical aperture. As a result, it has not been practical to mass produce surface wave devices with linewidths of about 0.5 $\mu$m using a 5× stepper.

While a higher magnification stepper could conceivably be provided to avoid this problem, this becomes commercially impractical. For example, a 10× stepper has been used for manufacture of semiconductor devices, but such a stepper is no longer commercially available due to field size constraints. The cost of such a stepper is justifiable for manufacturing relatively expensive semiconductor devices, but is not justifiable for economically manufacturing surface wave devices. Furthermore, due to the increased magnification of a 10× stepper, using this to produce surface wave devices would require a substantial increase in number of exposures, and hence in cost of manufacture, compared with using a 5× stepper. It is also observed that advanced 5× steppers are designed for processing relatively large (e.g. 30 cm) semiconductor wafers, and can not handle the small (e.g. 7.5 to 10 cm) wafers of piezoelectric material used for surface wave devices.

Accordingly, in practice surface wave device RF filters at frequencies in the range of 1.8 to 2.0 GHz have not been mass produced (as distinct from small numbers of devices being produced under laboratory conditions which are more favourable), and instead filters at such frequencies have had to be provided using other technologies; for example RF designers have had to use dielectric resonator filters having higher cost, greater size, and inferior characteristics compared with surface wave devices.

An object of this invention, therefore, is to provide an improved method of making surface wave devices, which can facilitate the manufacture of surface wave devices using sub-micron linewidths.

SUMMARY OF THE INVENTION

According to one aspect of this invention there is provided a method of making a surface wave device in which photoresist on a substrate of piezoelectnic material is exposed to define a conductor pattern including interdigital fingers of the surface wave device, wherein the exposure comprises the steps of exposing photoresist for a first subset of conductors in the pattern and subsequently exposing photoresist for a second subset of conductors in the pattern, the conductors of each of the first and second subsets of conductors in the pattern having a greater spacing than the conductors of the surface wave device.

Thus the method divides the conductor pattern into two parts each with twice the line spacing of that required for the whole conductor pattern, and provides overlaid exposures of these so that the whole conductor pattern is defined but the diffraction effects are substantially halved.

The method can include the step of developing exposed photoresist between the exposures for the first and second subsets of conductors, and can also include the step of forming conductors of the first subset of conductors in the pattern before the exposure of photoresist for the second subset of conductors.

Preferably, the first subset of conductors in the pattern comprises interdigital fingers connected to a first connection rail, and the second subset of conductors in the pattern comprises interdigital fingers connected to a second connection rail, of an interdigital transducer of the surface wave device. Where the surface wave device includes one or more reflection gratings, each of the first and second subsets of conductors in the pattern can comprise alternate fingers of each reflection grating.

Another aspect of this invention provides a method of making a surface wave device comprising the steps of: providing on at least one reticle a conductor pattern of a surface wave device in at least two parts, each defining a subset of conductors of the conductor pattern and together defining the whole conductor pattern, each of the at least two parts having a greater line spacing than would be required for defining the whole conductor pattern in a single pattern on the reticle; performing at least two exposures, each via a respective one of said at least two pairs on said at least one reticle, to define the whole conductor pattern of the surface wave device on a substrate of piezoelectric material; and forming a conductor pattern on the substrate in accordance with the defined whole conductor pattern.

Typically, each of said at least two exposures can comprise exposing photoresist on the substrate. The method can include the step of developing exposed photoresist between successive ones of said at least two exposures, and the step of forming the conductor pattern on the substrate can include the step of forming conductors on the substrate between successive ones of said at least two exposures.

Desirably, all of the parts of the whole conductor pattern of the surface wave device are provided on a single reticle. The at least two parts of the conductor pattern provided on the reticle preferably comprise a first part comprising interdigital fingers connected to a first connection rail and a second part comprising interdigital fingers connected to a second connection rail of an interdigital transducer of the surface wave device. These first and second parts can also each comprise alternate fingers of a reflection grating of the surface wave device.

A further aspect of this invention provides a method of making a surface wave device by forming conductors on a surface of a piezoelectric material in a conductor pattern defined by exposing photoresist via a reticle, wherein the conductor pattern is provided on the reticle in two parts each defining a set of substantially alternate fingers of the pattern, and the photoresist is exposed by two overlaid exposures each via a respective one of the two parts of the conductor pattern.

BRIEF DESCRIPTION OF THE DRAWINGS

The invention will be further understood from the following description with reference to the accompanying drawings, in which.

DETAILED DESCRIPTION

Figure 1:
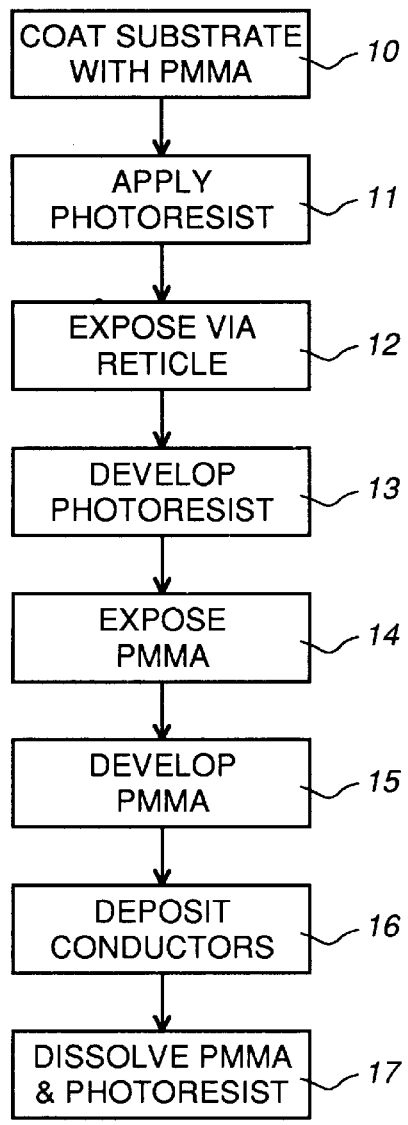
FIG. 1 shows a flow chart of a sequence of steps involved in a known method of making a surface wave device.
Figure 2:
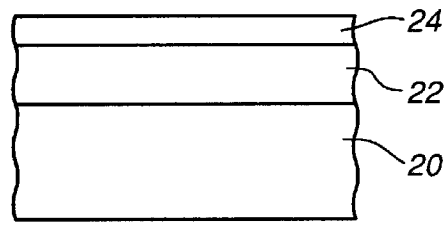
FIGS. 2 to 6 illustrate, diagrammatically and not to scale, results of processing steps in the sequence of steps in the flow chart of FIG. 1.
Figure 3:
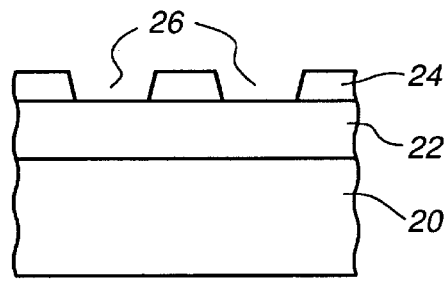

Referring to FIG. 1, a known method of making a surface wave device comprises a sequence of steps 10 to 17 which are described below also with reference to FIGS. 2 to 6, which illustrate results following the processing steps 11, 13, 15, 16, and 17 respectively. Although for simplicity this description refers to manufacture of a single surface wave device, it should be appreciated that it applies equally and simultaneously for a plurality of surface wave devices on the same wafer.

In the step 10, a substrate 20 of a selected piezoelectric material is coated with PMMA (polymethylmethacrylate) 22, which is a polymer sensitive to deep UV (ultraviolet) light. In the step 11, a photoresist layer 24 is applied in known manner, resulting in the structure illustrated diagrammatically in FIG. 2.

In the step 12, the photoresist layer 24 is selectively exposed to light via a reticle in a stepper, for example a 5× stepper as described above. The reticle comprises a glass plate having a layer of chromium on it, the chruomium having been removed by an electron beam and processing in the desired pattern (at the appropriate scale) of conductors to be formed on the piezoelectric substrate for making the surface wave device. The exposed photoresist is removed by development in the step 13, resulting in the structure illustrated diagrammatically in FIG. 3 with gaps 26 in the photoresist layer 24 where conductors are to be formed on the substrate 20.

Figure 4:
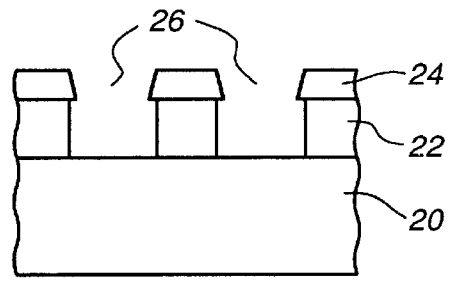

In the step 14, the structure is exposed to deep UV light to expose the PMMA beneath the gaps 26, and in the step 15 the exposed PMMA is removed by development, resulting in the structure illustrated diagrammatically in FIG. 4. The UV exposure step 14 is extended (over-exposure) so that the exposed PMMA, removed in the development step 15, undercuts the remaining photoresist 24 as illustrated in FIG. 4.

Figure 5:
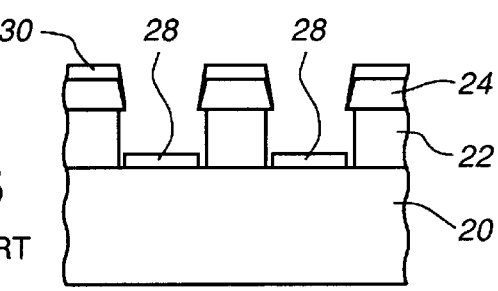

In the step 16, conductors 28 in the desired pattern are formed on the substrate 20 by evaporation of a desired metal onto the wafer, resulting in the structure illustrated diagrammatically in FIG. 5, in which it can also be seen that the metal is also deposited in a layer 30 on the remaining photoresist layer 24. The undercutting of the photoresist by the removed PMMA as described above ensures that the deposited conductors 28 are physically separate from the layer 30 and are precisely defined by the pattern of the remaining photoresist layer 24.

Figure 6:
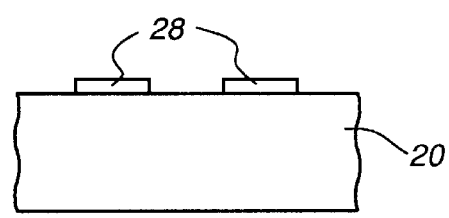

In the step 17, the remaining PMMA and photoresist are dissolved using a suitable solvent, and the metal layer 30 is thereby also removed, to leave the substrate 20 with the conductors 28 in the desired pattern as illustrated diagrammatically in FIG. 6.

Figure 7:
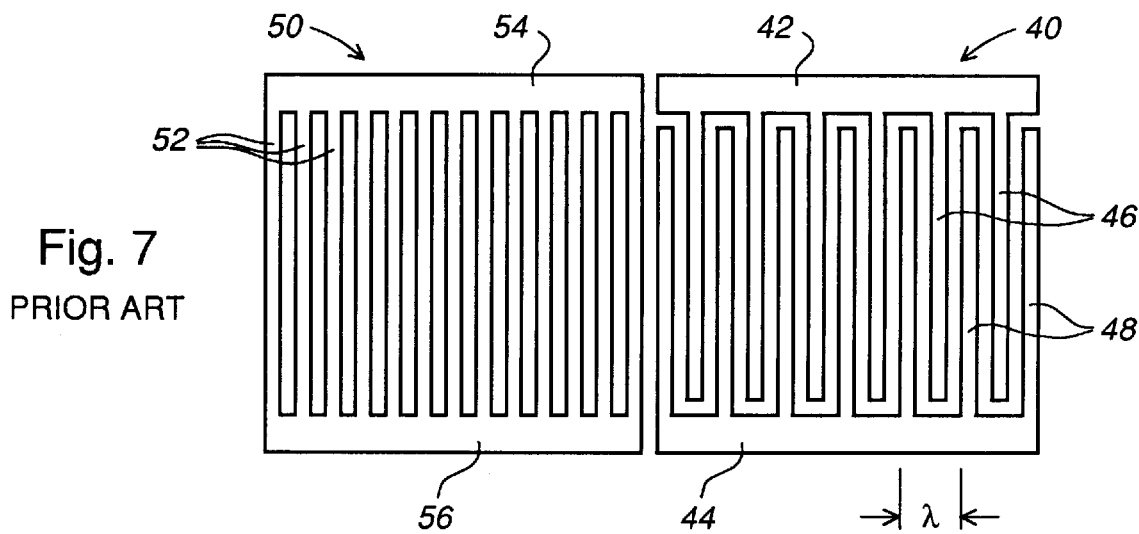
FIG. 7 illustrates, diagrammatically, not to scale, and for explanatory purposes only, conductors of a surface wave device of known form.

FIG. 7 illustrates conductors of a surface wave device. This illustration, and each of the illustrations in FIGS. 8a and 8b described below, is purely diagrammatic and only or the purposes of explaining the form of the conductors of a surface wave device. Typically, a surface wave device will include a plurality of reflection gratings and IDTs, each of these will include a relatively large number of fingers or electrodes, and the relative sizes and proportions of the fingers or electrodes and the connection rails will be different from those illustrated.

FIG. 7 illustrates an IDT 40 comprising two parallel connection rails 42 and 44 from which interdigital fingers or electrodes extend perpendicularly to the connection rails, with fingers 46 extending from the rail 42 and fingers 48 extending from the rail 44. Electrical connections (not shown) are made to the connection rails 42 and 44 for providing connections to the IDT 40, which transduces a surface wave propagating perpendicular to the interdigital fingers 46 and 48 on the piezoelectric substrate (not shown in FIG. 7) with a wavelength $\lambda$ which corresponds to the period of the fingers 46 and 48 as illustrated. Typically the IDT 40 has a metallization ratio of 0.5, with each of the fingers 46 and 48 and each space between adjacent fingers having a width (in the direction of surface wave propagation) of $\lambda/4$.

FIG. 7 also illustrates, adjacent to the IDT 40, a reflection grating 50 which comprises fingers 52, in this case having the same spacing, periodicity, and metallization ratio as the interdigital fingers 46 and 48 of the IDT 40 (although as is known this need not be the case; advantageously slightly different parameters can be used to improve the surface wave device performance), extending between parallel connection rails 54 and 56, for reflecting back to the IDT 40 a surface wave propagated from the IDT. The fingers 52 can be electrically floating, and one or both of the rails 54 and 56 need not be provided, or the fingers 52 can be grounded via a suitable electrical connection (not shown) for example to one or both of the rails 54 and 56.

It can be appreciated from the illustration in FIG. 7 that the conductors of the IDT 40 and reflection grating 50, which are constituted by conductors 28 as shown in FIG. 6 conventionally formed as described above, comprise straight and rectangular components forming the desired conductor pattern. This is typically the case regardless of the particular form of practical surface wave device that may be desired for filtering as discussed above. For example a practical surface wave device may comprise one or more IDTs of the general form of the IDT 40, with or without reflection gratings of the general form of the reflection grating 50, for example in a ladder structure or in a longitudinally coupled resonator structure for RF filtering, the conductor pattern being made up of straight and rectangular conductive components as illustrated in FIG. 7.

For an RF filter having a center frequency in the range of 1.8 to 2.0 GHz, with a piezoelectlic substrate such as lithium niobate or lithium tantalate having a surface wave propagation velocity of typically about 3200 to 4000 m/s, the wavelength $\lambda$ is about 1.6 to 2.2 tm (microns) so that the width of each finger or electrode 46, 48, or 52 and the width of each space between adjacent fingers is about 0.4 to 0.55 $\mu$m. A typical 5× stepper for a 7.5 cm wafer, as discussed in the background of the invention, is rated to enable manufacture of surface wave devices with linewidths down to 0.7 $\mu$m, and may practically be used for manufacture of surface wave devices with linewidths down to 0.56 $\mu$m. However, manufacture of surface wave devices with smaller linewidths in the same manner has not been practical, in particular due to diffraction characteristics at these linewidths.

The invention avoids this problem by dividing at least the step 12 described above, of exposing the photoresist layer 24 via the reticle containing the conductor pattern of the surface wave device, into two paits, in each of which diffraction effects are substantially reduced by effectively doubling the spacing between the conductors for which the exposure is being made, the two exposures being overlaid to expose the total conductor pattern for the surface wave device. A first, preferred, embodiment of this is explained further below with reference to FIGS. 8*a*, 8*b*, and 9.

Figure 8A:
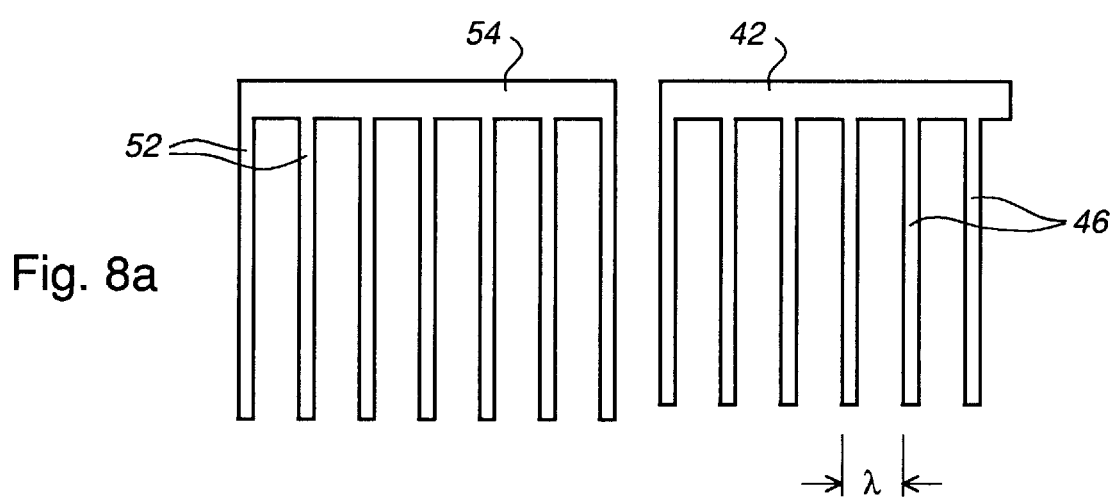
FIGS. 8a and 8b illustrate, in a similar manner to FIG. 7, subsets of the conductors of a surface wave device, for use in explaining the present invention.
Figure 8B:
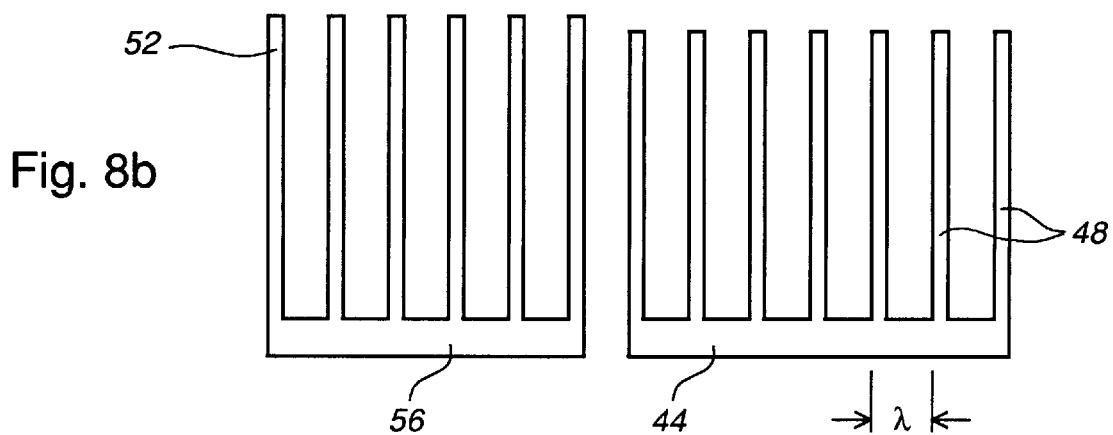

FIG. 8*a* illustrates a first subset of the conductors shown in FIG. 7, comprising the connection rail 42 of the IDT 40 and the fingers 46 connected thereto, and the connection rail 54 of the reflection grating 50 and alternate ones of the fingers 52 connected thereto. FIG. 8*b* illustrates a second subset comprising the remainder of the conductors shown in FIG. 7, comprising the connection rail 44 and the fingers 48 connected thereto, and the connection rail 56 and the remaining alternate fingers 52. In each of FIGS. 8*a* and 8*b*, as illustrated, the finger periodicity is halved to one finger every wavelength $\lambda$, compared with 2 fingers every wavelength $\lambda$ in FIG. 7.

Figure 9:
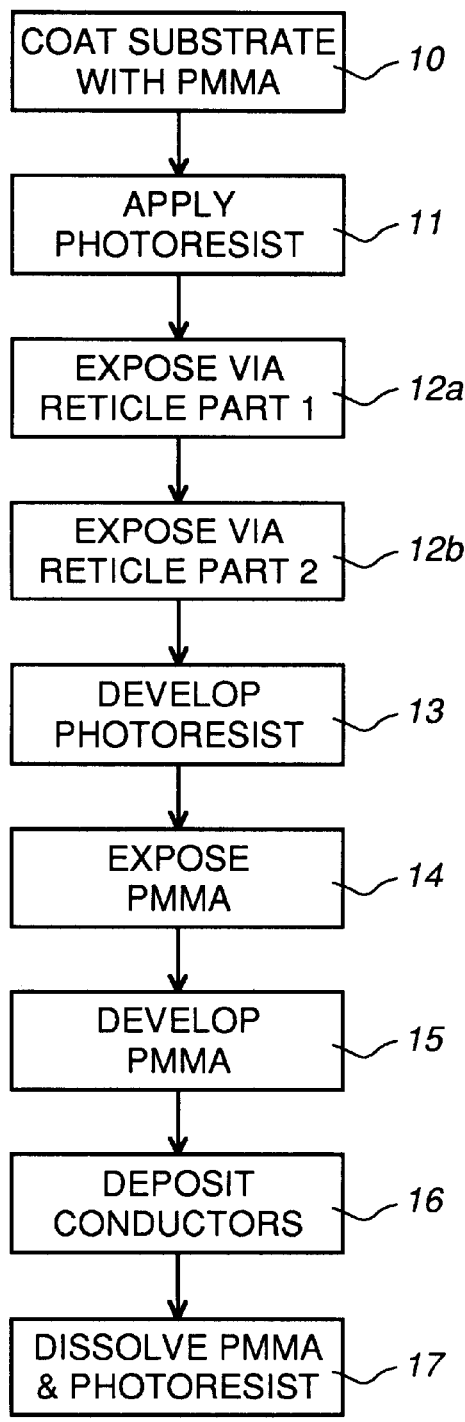
FIGS. 9 to 11 show flow charts of sequences of steps involved in methods of making a surface wave device in accordance with alternative embodiments of this invention.

The sequence of steps shown in FIG. 9 for making a surface wave device in accordance with a preferred embodiment of this invention is the same as that of FIG. 1, and is numbered accordingly, except that the known step 12 is divided into two steps 12*a* and 12*b*. In order to carry out these steps, the surface wave device conductor pattern is formed in two separate parts on the same reticle, the two parts corresponding to the two subsets of conductors as represented in FIGS. 8*a* and 8*b*. For example for a 5× stepper, the two parts of the reticle define the conductor patterns in the manner of FIGS. 8*a* and 8*b* at a magnification of five times the actual size. In the first step 12*a*, the first part of the reticle for defining the subset of conductors shown in FIG. 8*a* is bladed (i.e. an exposure aperture is defined around this part of the reticle) and the photoresist layer 24 is exposed. In the second step 12*b*, the second part of the reticle for defining the subset of conductors shown in FIG. 8*b* is bladed, the stage carrying the substrate is moved to overlay the exposure image in the desired position (as shown by FIG. 7) relative to the exposure in the step 12*a*, and the photoresist layer 24 is again exposed. The substrate is subsequently processed in conventional manner as shown by the steps 13 to 17 in FIG. 9.

Because both of the conductor subset patterns of FIGS. 8*a* and 8*b* are provided on the same reticle, and the stage carrying the substrate can be moved with great accuracy, a very precise overlay of the two subsets of conductor patterns can be achieved. Consequently the desired conductor pattern, represented by FIG. 7, can be very precisely produced by the overlaying of the two subsets of the conductor pattern, represented by FIGS. 8*a* and 8*b*.

At the same time, because the fingers 46 and 52 of conductors in the conductor subset of FIG. 8*a*, and the fingers 48 and 52 of conductors in the conductor subset of FIG. 8*b*, have an increased spacing so that for each exposure step 12*a* and 12*b* there is only one conductor and one space for each wavelength $\lambda$ of the surface wave device, instead of two conductors and two spaces as in the final conductor pattern of FIG. 7, the diffraction effects associated with each exposure are substantially halved.

Consequently, a 5× stepper as discussed above can be used to enable manufacture of surface wave devices with potentially halved linewidths, i.e. down to a rated value of half of 0.7 $\mu$m, i.e. 0.35 $\mu$m, or less. In practice a lower limit of about 0.4 $\mu$m may arise from processing constraints, but this is sufficient to permit practical and economical manufacture of surface wave devices for RF filtering at frequencies of at least about 2GHz.

It can be appreciated that the precision and diffraction effects associated with such parts of the conductor pattern as the connection rails 42, 44, 54, and 56 are much less than for the fingers 46, 48, and 52, and accordingly the former parts of the conductor pattern can be provided relatively arbitrarily in either or both of the pattern subsets of FIGS. 8*a* and 8*b*. In FIGS. 8*a* and 8*b* the finger patterns are divided between the two subsets so that each subset includes only one finger per wavelength, rather than two fingers per wavelength as in FIG. 7.

As described above, the two subsets of conductors of FIGS. 8*a* and 8*b* are provided on the same reticle. Alternatively, the two subsets of conductors could be provided on two different reticles, with alignment marks to position them in the stepper for the respective exposures of steps 12*a* and 12*b*. Providing the two subsets on the same reticle is preferred because it is simpler, more convenient, and avoids any errors due to alignment of two different reticles in the stepper. However, it is observed that any small alignment errors that may occur may not substantially adversely affect the characteristics of the surface wave device that is being made, because the center frequency of the surface wave device is mainly determined by the peliodicity of the fingers connected to each connection rail, for example the peiiodicity $\lambda$ of the fingers 46 connected to the rail 42, or of the fingers 48 connected to the rail 44, rather than by the spacing of adjacent fingers 46 and 48 connected to the different rails 42 and 44.

The method described above and illustrated by FIG. 9 involves relatively little additional processing compared with the conventional method illustrated by FIG. 1, because it only involves preparation of a different reticle and two exposure steps 12*a* and 12*b* instead of one. Accordingly, it is very easy and economical to implement. However, it is conceivable that molecular mobility of the photoresist layer 24, across boundaries between its exposed (in the step 12*a*) and unexposed parts, may be a problem during the second exposure step 12*b*. Such a potential problem can be avoided by a modification of the method represented by the sequence of steps shown in FIG. 10.

Figure 10:
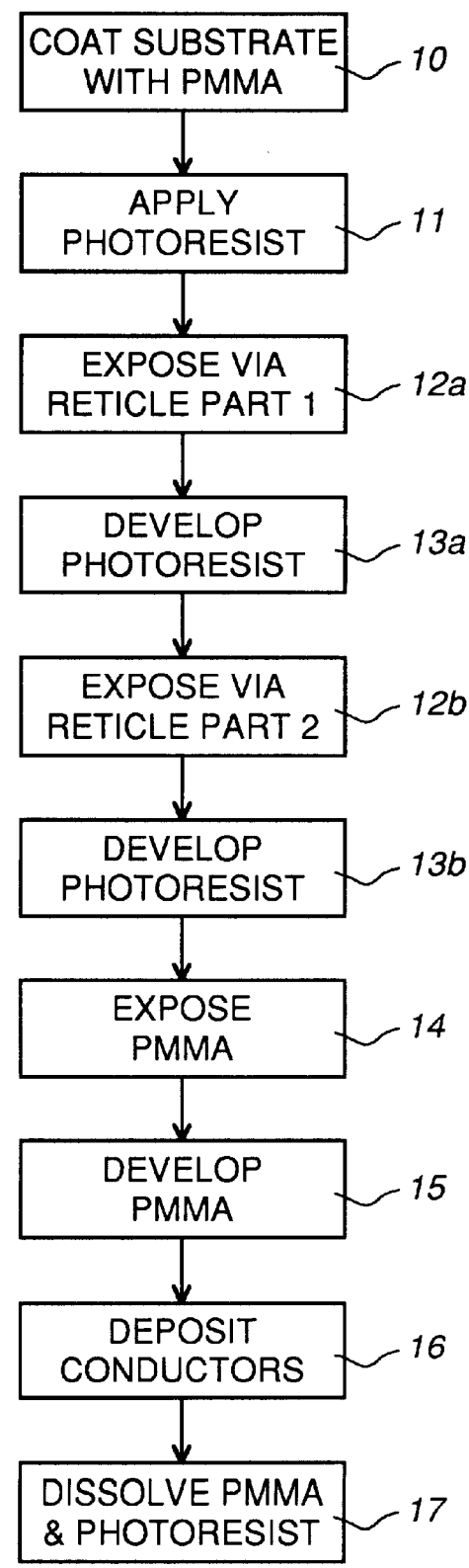

Referring to FIG. 10, the first three steps 10, 11, and 12a are the same as described above with reference to FIG. 9. Following the step 12a, as shown in FIG. 10 by a step 13a, the substrate is removed from the stepper and the parts of the photoresist layer 24 exposed in the step 12a are removed by development, as described above for the step 13 in FIG. 1. The substrate is then returned to the stepper, the photoresist layer 24 is given its second exposure in the step 12b as described above with reference to FIG. 9, and then the parts of the photoresist layer 24 exposed in this second exposure step 12b are removed by development in a step 13b. Thus in this alternative, the single development step 13 of the method of FIG. 9 is replaced by two development steps 13a and 13b, immediately following the two exposure steps 12a and 12b respectively. The remaining steps 14 to 17 in the method of FIG. 10 are the same as in the methods of FIGS. 1 and 9.

The method of FIG. 10 has the disadvantage that the removal and replacement of the substrate from the stepper between the two exposure steps 12a and 12b can introduce a small overlay error, but this error may be sufficiently small as to be practically negligible. It also requires the additional photoresist development step. Accordingly, the method of FIG. 9 may be less preferable to this alternative unless photoresist mobility is a problem.

A further potential disadvantage of the alternative method of FIG. 10 is that, during the second exposure step 12b, local light reflections may occur in regions where parts of the photoresist layer 24 have been removed in the step 13a, resulting in undesired exposures of parts of the photoresist layer 24 to light. This potential disadvantage can be avoided by a further alternative method illustrated by FIG. 11.

Figure 11:
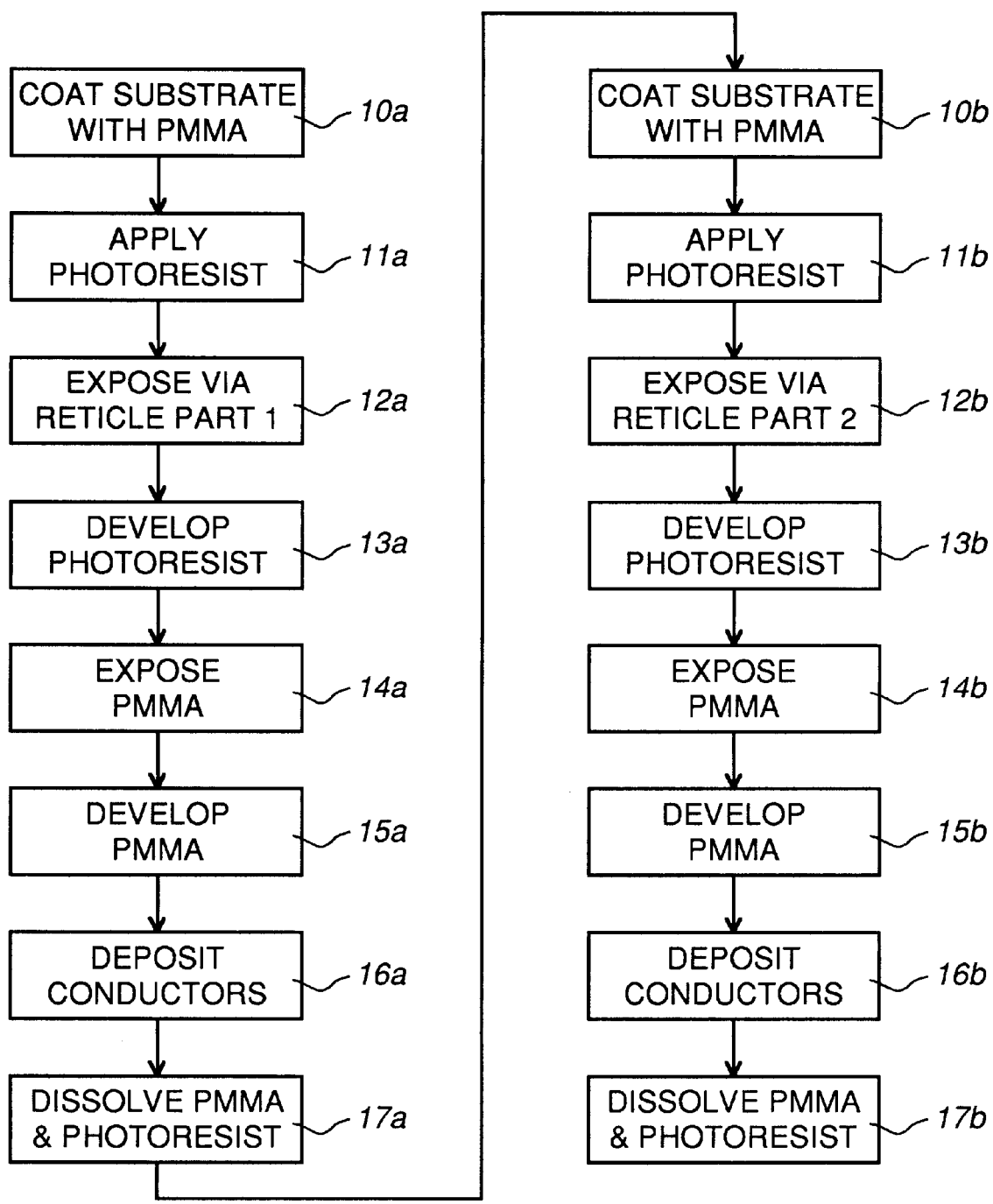

As shown by FIG. 11, the further alternative method comprises performing steps 10a to 17a, which correspond to steps 10 to 17 respectively of the known method of FIG. 1 except that the exposure step 12a exposes only the first subset of conductors represented in FIG. 8a as described above. This further alternative method comprises subsequently performing steps 10b to 17b, which correspond to the steps 10 to 17 respectively of the known method of FIG. 1 except that the second exposure step 12b exposes the second subset of conductors represented in FIG. 8b as described above. It can be appreciated that in the step 10b the layer of PMMA that is coated onto the substrate 20 is applied over the first subset of conductors 28 which have been formed on the substrate in the steps 10a to 17a. This further alternative method has the disadvantage that all of the conventional steps 10 to 17 are performed twice, once for the first subset and again for the second subset of conductors 28, thereby doubling the processing required to make the surface wave device. However, even this method has the advantage of enabling the practical manufacture of surface wave devices for filtering at center frequencies for which surface wave devices have not hitherto been widely available.

It can be appreciated that, although the invention has been described above in relation to a surface wave device using fingers as illustrated in FIG. 7, the invention is equally applicable to making surface wave devices having other forms of fingers, such as devices using IDTs having split or bifurcated fingers or using SPUDTs (Single Phase Unidirectional Transducers) with fingers which may have different widths and metallization ratios. In such cases, the two subsets of conductors are likewise selected from the total conductor pattern to reduce, and advantageously to minimize, their line density in, and hence diffraction effects in each exposure via, the respective part of the reticle.

Thus although the invention has been described above in relation to specific frequencies, linewidths, metallization ratios, and surface wave devices and applications, it should be appreciated that these are given by way of example and the invention is not limited to these details, but is applicable to the making of any surface wave devices. Furthermore, although the invention has been described in terms of dividing the exposure of the photoresist layer into two steps using two subsets of the conductors, it can be appreciated that the same principles can be applied to any greater number of exposures and corresponding subsets of conductors of the surface wave device, and the invention is also not limited in this respect.

Thus although particular embodiments of the invention have been described in detail, it should be appreciated that numerous modifications, variations, and adaptations may be made without departing from the scope of the invention as defined in the claims.

What is claimed is:

1. A method of making a surface wave device comprising the steps of:

providing on at least one reticle a conductor pattern of a surface wave device in at least two parts, each part defining a subset of conductors of the conductor pattern and the parts together defining the whole conductor pattern, wherein the conductor pattern defines interdigital fingers of the surface wave device and each of the at least two parts defines a respective subset of said interdigital fingers having a greater line spacing than would be required for defining the whole conductor pattern in a single pattern on the reticle;

performing at least two exposures, each via a respective one of said parts of the conductor pattern, to define the whole conductor pattern of the surface wave device on a substrate of piezoelectric material; and forming a conductor pattern on the substrate in accordance with the defined whole conductor pattern.

2. A method as claimed in claim 1 wherein each of said at least two exposures comprises exposing a photoresist on the substrate.

3. A method as claimed in claim 2 and including the step of developing exposed photoresist between successive ones of said at least two exposures.

4. A method as claimed in claim 3 wherein the step of forming the conductor pattern on the substrate includes the step of forming conductors on the substrate between successive ones of said at least two exposures.

5. A method as claimed in claim 1 wherein all of the parts of the whole conductor pattern of the surface wave device are provided on a single reticle.

6. A method as claimed in claim 5 wherein the at least two parts of the conductor pattern provided on the reticle comprise a first part comprising interdigital fingers connected to a first connection rail and a second part comprising interdigital fingers connected to a second connection rail of an interdigital transducer of the surface wave device.

7. A method as claimed in claim 5 wherein the at least two parts of the conductor pattern provided on the reticle comprise a fir st and a second part each comprising alternate fingers of a reflection grating of the surface wave device.

8. A method of making a surface wave device by forming conductors on a surface of a piezoelectric material in a conductor pattern defined by exposing a photoresist via a reticle, wherein the conductor pattern is provided on the reticle in two parts each defining a set of substantially alternate fingers of the pattern, and the photoresist is exposed by two overlaid exposures each via a respective one of the two parts of the conductor pattern.

9. A method as claimed in claim 8 and including the step of developing exposed photoresist between the two exposures.

10. A method as claimed in claim 9 wherein the step of forming conductors on the surface of the piezoelectuic material includes the step of forming conductors between the two exposures.

* * * * *